(12) United States Patent
Bai et al.

(10) Patent No.: US 12,464,700 B2
(45) Date of Patent: Nov. 4, 2025

(54) METHOD OF MANUFACTURING SEMICONDUCTOR STRUCTURE

(71) Applicant: CHANGXIN MEMORY TECHNOLOGIES, INC., Hefei (CN)

(72) Inventors: Jie Bai, Hefei (CN); Kang You, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 758 days.

(21) Appl. No.: 17/651,577

(22) Filed: Feb. 18, 2022

(65) Prior Publication Data
US 2022/0352175 A1 Nov. 3, 2022

Related U.S. Application Data

(63) Continuation of application No. PCT/CN2021/111890, filed on Aug. 10, 2021.

(30) Foreign Application Priority Data

Apr. 28, 2021 (CN) .......................... 202110469981.4

(51) Int. Cl.
H10B 12/00 (2023.01)
(52) U.S. Cl.
CPC ............. *H10B 12/05* (2023.02); *H10B 12/50* (2023.02)
(58) Field of Classification Search
CPC ....... H01L 21/28238; H01L 21/823412; H01L 21/823462; H01L 21/823807;
(Continued)

(56) References Cited

U.S. PATENT DOCUMENTS 6,150,234 A 11/2000 Olsen
6,573,130 B1 6/2003 Patelmo et al.
(Continued)

FOREIGN PATENT DOCUMENTS

CN 1905160 A 1/2007
CN 105826376 B 1/2019
(Continued)

OTHER PUBLICATIONS

International Search Report cited in PCT/CN2021/111890 mailed Jan. 30, 2022, 8 pages.
(Continued)

*Primary Examiner* — Britt D Hanley
*Assistant Examiner* — Kevin Quinto
(74) *Attorney, Agent, or Firm* — Syncoda LLC; Feng Ma

(57) ABSTRACT

The present disclosure relates to the technical field of semiconductor manufacturing, and provides a method of manufacturing a semiconductor structure. The method of manufacturing a semiconductor structure includes: providing a substrate; forming a mask layer on the substrate; removing a part of the mask layer on a non-array region; forming a first oxide layer on the non-array region; removing a part of the first oxide layer on a first transistor region, to expose a top surface of the first transistor region; forming an epitaxial layer on the exposed top surface of the first transistor region; removing a part of the first oxide layer on a second transistor region; and forming a second oxide layer on the second transistor region and the epitaxial layer.

13 Claims, 7 Drawing Sheets

(58) Field of Classification Search
CPC ... H01L 27/088; H01L 27/092; H01L 29/517; H10B 12/05; H10B 12/09; H10B 12/50; H10D 64/691; H10D 84/0128; H10D 84/0144; H10D 84/0167; H10D 84/038; H10D 84/83; H10D 84/85
See application file for complete search history.

(56) References Cited

U.S. PATENT DOCUMENTS

| | | | |
|---|---|---|---|
| 7,202,535 B2 | 4/2007 | Goldbach et al. | |
| 2001/0048136 A1* | 12/2001 | Kudo | H01L 21/8238 257/E21.632 |
| 2003/0104663 A1* | 6/2003 | Visokay | H01L 21/823842 257/E21.637 |
| 2004/0222477 A1* | 11/2004 | Aller | H01L 29/66795 257/412 |
| 2007/0015325 A1* | 1/2007 | Goldbach | H01L 21/823857 257/E21.639 |
| 2009/0090934 A1* | 4/2009 | Tezuka | H01L 29/66795 257/190 |
| 2010/0019358 A1* | 1/2010 | Cheng | H01L 29/66795 257/E29.132 |
| 2010/0124805 A1* | 5/2010 | Na | H01L 21/823842 257/E21.639 |
| 2010/0314715 A1* | 12/2010 | Fujimoto | H10B 12/315 257/532 |
| 2012/0129330 A1 | 5/2012 | Kim et al. | |
| 2012/0135592 A1* | 5/2012 | Kim | H10B 12/50 257/E21.294 |

FOREIGN PATENT DOCUMENTS

| | | | |
|---|---|---|---|
| CN | 112599593 A | 4/2021 | |
| EP | 1298712 A2 | 4/2003 | |
| EP | 1298712 A3 | 12/2004 | |
| JP | 2000133729 A | 5/2000 | |
| JP | 2001339070 A | 12/2001 | |

OTHER PUBLICATIONS

European Search Report cited in EP21935429.7 mailed Sep. 26, 2023, 9 pages.
European patent office action in application No. 21935429.7, mailed on May 15, 2025.

* cited by examiner

METHOD OF MANUFACTURING SEMICONDUCTOR STRUCTURE

CROSS-REFERENCE TO RELATED APPLICATIONS

This is a continuation of International Application No. PCT/CN2021/111890, filed on Aug. 10, 2021, which claims the priority to Chinese Patent Application 202110469981.4, titled "METHOD OF MANUFACTURING SEMICONDUCTOR STRUCTURE" and filed with the China National Intellectual Property Administration (CNIPA) on Apr. 28, 2021. The entire contents of International Application No. PCT/CN2021/111890 and Chinese Patent Application 202110469981.4 are incorporated herein by reference.

TECHNICAL FIELD

The present disclosure relates to the technical field of semiconductors, in particular to a method of manufacturing a semiconductor structure.

BACKGROUND

The dynamic random access memory (DRAM) is a semiconductor memory that randomly writes and reads data at high speed, and is widely used in data storage devices.

A DRAM device includes a substrate, which is provided with a peripheral region, a core region, and multiple array regions, where the core region surrounds each of the array regions and the peripheral region surrounds the core region. Memory cells are arranged in the array regions. Each memory cell usually includes a capacitor and a transistor; the gate of the transistor is connected to a word line (WL), the drain is connected to a bit line, and the source is connected to the capacitor. The peripheral region is provided with a driver circuit, a clock circuit, etc. The core region includes a P-type transistor and an N-type transistor, and a SiGe layer is embedded in a channel region of the P-type transistor to increase the carrier mobility, thus improving the storage performance of the DRAM device.

However, the above method of manufacturing the DRAM device causes a severe damage to the SiGe layer, thus affecting the storage performance of the DRAM device.

SUMMARY

The present disclosure provides a method of manufacturing a semiconductor structure, inducing:
  providing a substrate, where the substrate includes an array region and a non-array region, the non-array region surrounds the array region, and the non-array region includes a first transistor region and a second transistor region;
  forming a mask layer on the substrate;
  removing the mask layer on the non-array region;
  forming a first oxide layer on the non-array region;
  removing the first oxide layer on the first transistor region, to expose a top surface of the first transistor region;
  forming an epitaxial layer on the exposed top surface of the first transistor region;
  removing the first oxide layer on the second transistor region; and
  forming a second oxide layer on the second transistor region and the epitaxial layer.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person of ordinary skill in the art may still derive other drawings from these accompanying drawings without creative efforts.

DESCRIPTION OF REFERENCE NUMERALS

1—core region NMOS; 2—core region PMOS; 3—peripheral region NMOS; 4—peripheral region PMOS; 5—hard mask layer; 6—SiGe layer; 7—thick gate oxide layer; 8—thin gate oxide layer; 100—semiconductor structure; 10—substrate; 11—array region; 12—core region; 13—peripheral region; 14—first transistor region; 15—second transistor region; 16—third transistor region; 17—fourth transistor region; 20—mask layer; 21—silicon dioxide layer; 22—silicon nitride layer; 30—first oxide layer; 40—epitaxial layer; 50—second oxide layer.

DETAILED DESCRIPTION

In the technical field of semiconductor manufacturing, a dynamic random access memory (DRAM) is a semiconductor memory that randomly writes and reads data at a high speed, and is widely used in data storage devices or apparatuses. A DRAM device includes a substrate, which is provided with a peripheral region, a core region, and multiple array regions, where the core region surrounds each of the array regions and the peripheral region surrounds the core region. Memory cells are arranged in the array regions. Each memory cell usually includes a capacitor and a transistor; the gate of the transistor is connected to a word line (WL), the drain is connected to a bit line, and the source is connected to the capacitor. The peripheral region is provided with a driver circuit, a clock circuit, etc. The core region includes a P-type transistor and an N-type transistor, and a SiGe layer is generally embedded in a channel region of the P-type transistor to increase the carrier mobility, thus improving the storage performance of the DRAM device.

Figure 1:
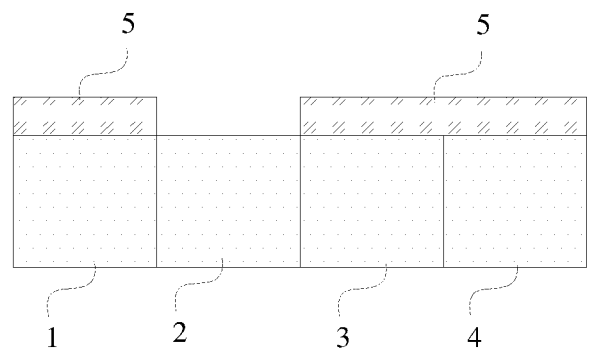
FIG. 1 is a schematic structural diagram of a device after removal of a hard mask layer in a core region PMOS during a manufacturing process in the related technology.
Figure 2:
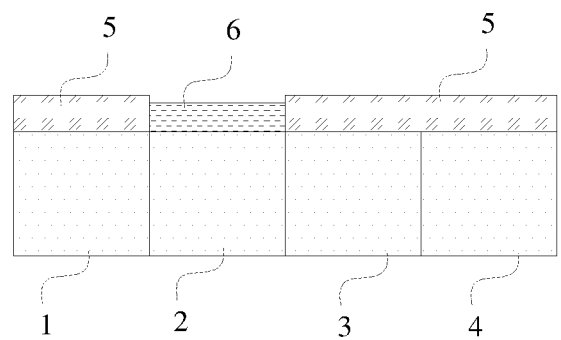
FIG. 2 is a schematic structural diagram of the device after deposition of a SiGe layer in the core region PMOS during the manufacturing process in the related technology.
Figure 3:
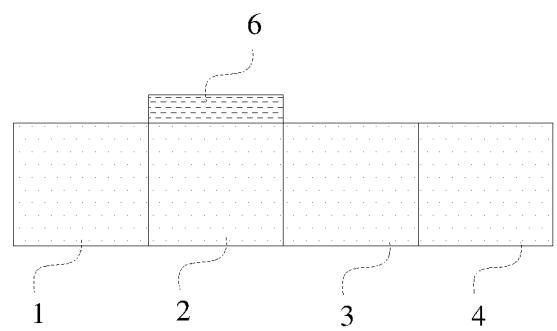
FIG. 3 is a schematic structural diagram of the device after removal of a hard mask layer during the manufacturing process in the related technology.
Figure 4:
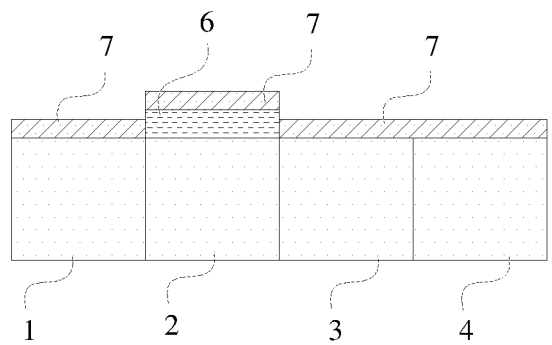
FIG. 4 is a schematic structural diagram of the device after deposition of a thick gate oxide layer during the manufacturing process in the related technology.
Figure 5:
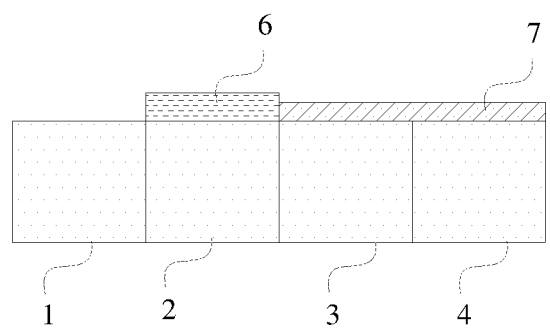
FIG. 5 is a schematic structural diagram of the device after removal of a thick gate oxide layer in a core region during the manufacturing process in the related technology.
Figure 6:
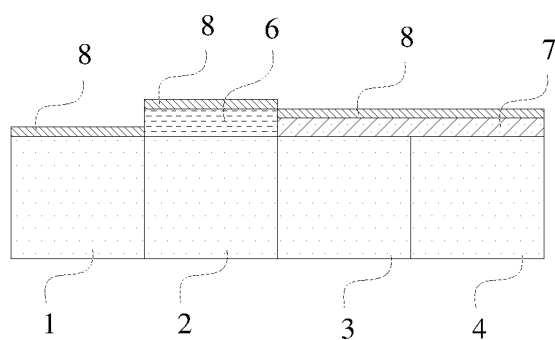
FIG. 6 is a schematic structural diagram of the device after deposition of a thin gate oxide layer during the manufacturing process in the related technology.

Specifically, FIG. 1 is a schematic structural diagram of a device after removal of a hard mask layer in a core region PMOS during a manufacturing process in the related technology. FIG. 2 is a schematic structural diagram of the device after deposition of a SiGe layer in the core region PMOS during the manufacturing process in the related technology. FIG. 3 is a schematic structural diagram of the device after removal of a hard mask layer during the manufacturing process in the related technology. FIG. 4 is a schematic structural diagram of the device after deposition of a thick gate oxide layer during the manufacturing process of a device in the related technology. FIG. 5 is a schematic structural diagram of the device after removal of a thick gate oxide layer in a core region during the manufacturing process in the related technology. FIG. 6 is a schematic structural diagram of the device after deposition of a thin gate oxide layer during the manufacturing process in the related technology.

As shown in FIG. 1 to FIG. 6, in the related technology, devices in a core region are usually manufactured according to the following method: a hard mask layer 5 on a core region PMOS2 is removed first, to expose the top surface of the core region PMOS2. A SiGe layer 6 is then deposited on the top surface of the core region PMOS2. Then, the hard mask layer 5 on a core region NMOS1, a peripheral region PMOS4, and a peripheral region NMOS3 is removed by wet etching to expose the top surface of the core region NMOS1, the peripheral region PMOS4, and the peripheral region NMOS3. Next, a thick gate oxide layer 7 is deposited on the core region PMOS2, the core region NMOS1, the peripheral region PMOS4, and the peripheral region NMOS3. Then, the thick gate oxide layer 7 on the core region PMOS2 and the core region NMOS1 is removed. Finally, a thin gate oxide layer 8 is deposited on the core region PMOS2 and the core region NMOS1.

However, in the foregoing manufacturing method, after deposition of the SiGe layer 6, the SiGe layer 6 is damaged when the hard mask layer 5 is removed through wet etching, and the SiGe layer 6 goes through multiple cleaning processes in the subsequent manufacturing, which greatly damages the SiGe layer 6, thus affecting the storage performance of the DRAM device.

Accordingly, the method of manufacturing a semiconductor structure provided by the present disclosure, the mask layer is formed on the substrate, to protect structural layers of the array regions and prevent the structural layers of the array region from being damaged; the mask layer on the non-array region is removed to expose the substrate of the non-array region; the first oxide layer is formed on the surface of the substrate of the non-array region, to be used as a barrier layer or insulation layer of the structure on the non-array region; the first oxide layer on the first transistor region is removed to expose the substrate of the first transistor region. In addition, the first oxide layer can further act as a mask, such that the epitaxial layer is formed on the exposed surface of the substrate of the first transistor region; the first oxide layer on the second transistor region is removed to expose the substrate of the second transistor region, such that the second oxide layer is formed on the surface of the substrate of the second transistor region. In the foregoing manufacturing method, the epitaxial layer is formed after formation of the first oxide layer. On the one hand, the first oxide layer can act as a mask to prevent the epitaxial layer from growing out of the substrate of the first transistor region. On the other hand, the damage caused by wet etching of the mask layer to the epitaxial layer can be prevented. In addition, after the forming the epitaxial layer, the epitaxial layer is not provided too early, thus reducing the damage caused by excessive cleaning processes to the epitaxial layer, reducing the damage caused by the method of manufacturing a semiconductor structure to the epitaxial layer, and improving the storage performance of the semiconductor structure.

In order to make the objectives, technical solutions and advantages of the embodiments of the present disclosure clearer, the technical solutions in the embodiments of the present disclosure are described in further detail below with reference to the accompanying drawings in the exemplary embodiments of the present disclosure. In the drawings, the same or similar numerals represent the same or similar elements or elements having the same or similar functions throughout the specification. The described embodiments are some rather than all of the embodiments of the present disclosure. The embodiments described below with reference to the accompanying drawings are exemplary, and are only used to explain the present disclosure but should not be construed as a limitation to the present disclosure. All other embodiments obtained by those of ordinary skill in the art based on the embodiments of the present disclosure without creative efforts should fall within the protection scope of the present disclosure. The embodiments of the present disclosure are described in detail below with reference to the drawings.

Figure 7:
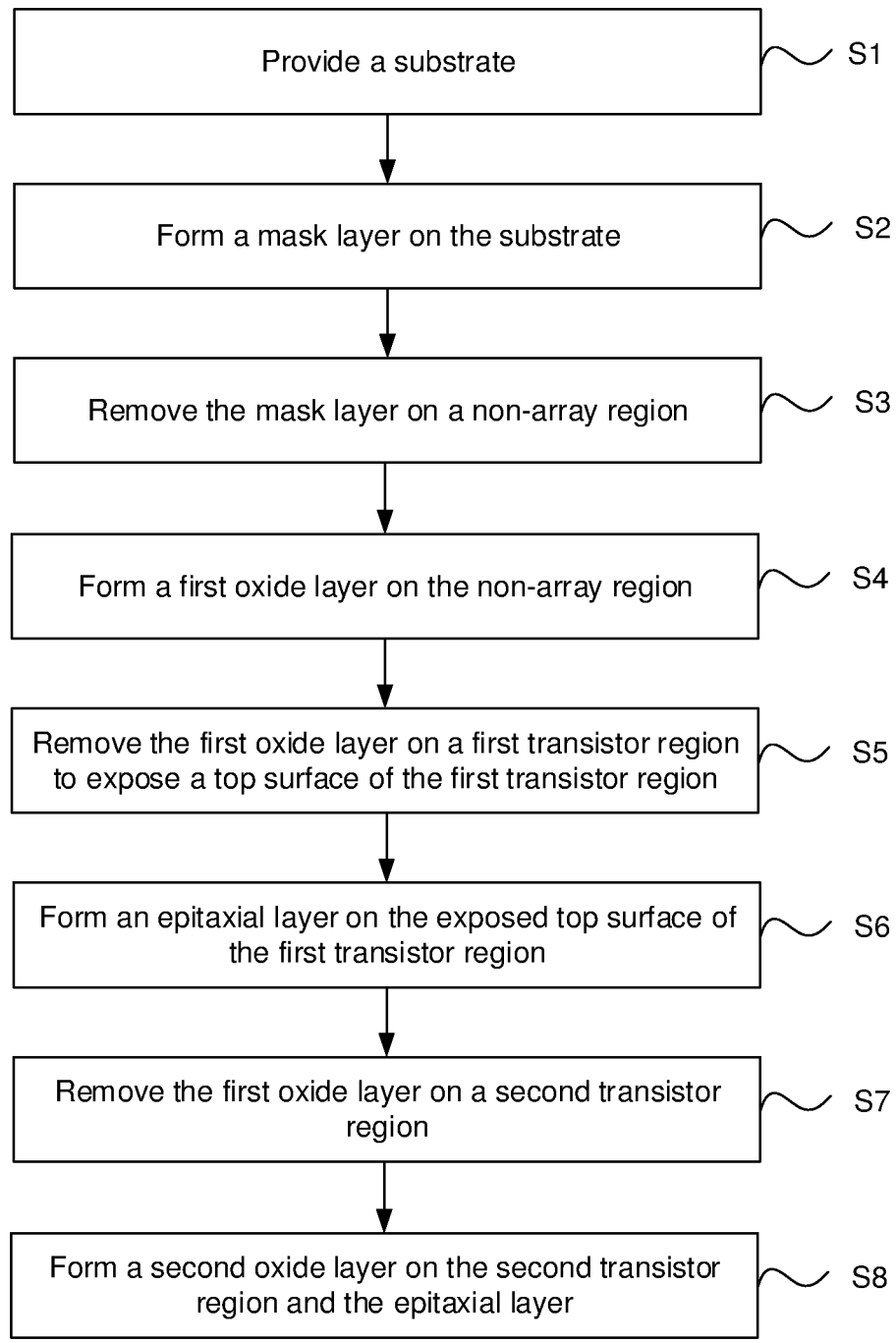
FIG. 7 is a schematic flowchart of a method of manufacturing a semiconductor structure according to an embodiment of the present disclosure.
Figure 8:
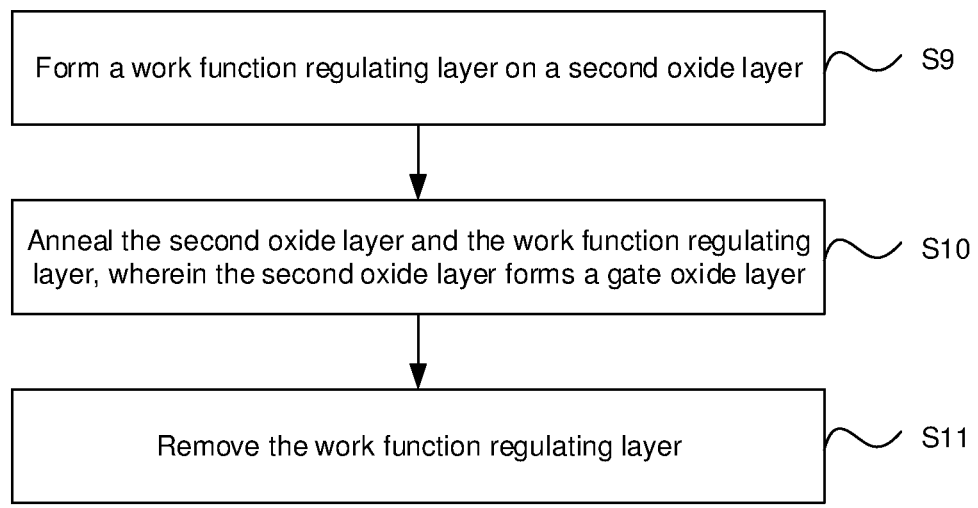
FIG. 8 is a schematic flowchart of a work function regulating process in the method of manufacturing a semiconductor structure according to an embodiment of the present disclosure.
Figure 9:
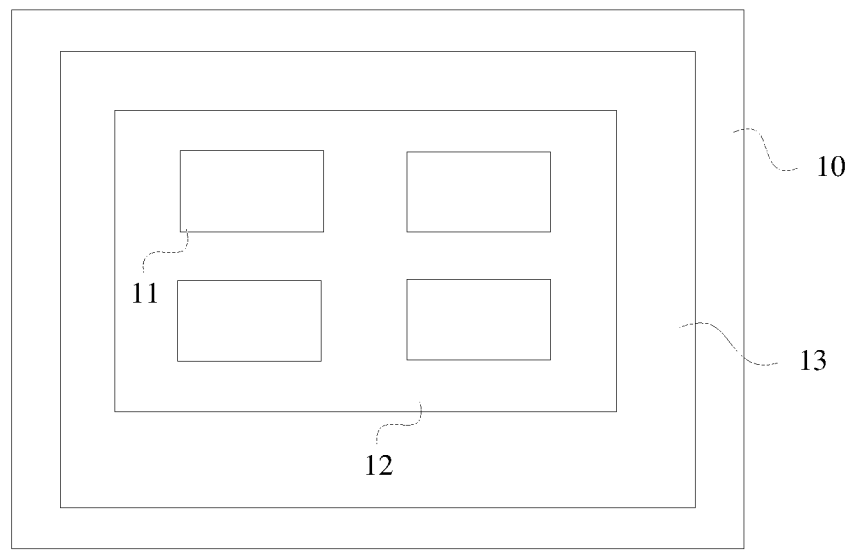
FIG. 9 is a schematic structural diagram of a semiconductor structure according to an embodiment of the present disclosure.
Figure 10:
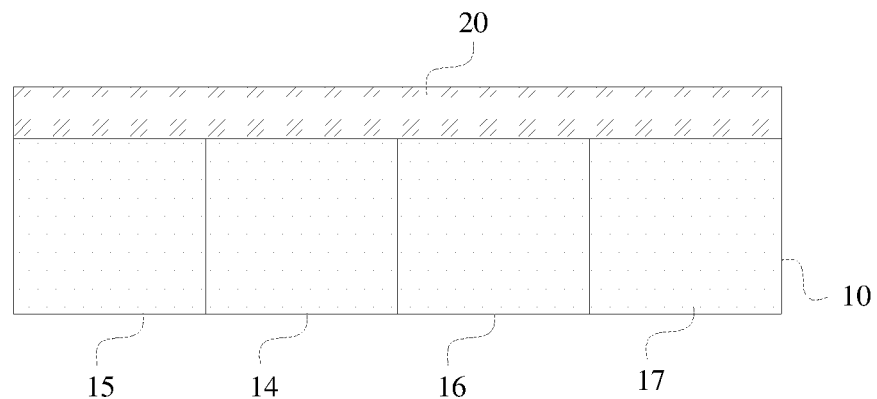
FIG. 10 is a schematic structural diagram after forming of a mask layer in the method of manufacturing a semiconductor structure according to an embodiment of the present disclosure.
Figure 11:
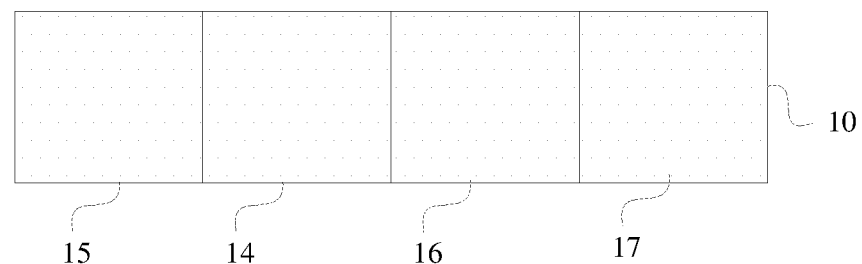
FIG. 11 is a schematic structural diagram after removal of the mask layer in the method of manufacturing a semiconductor structure according to an embodiment of the present disclosure.
Figure 12:
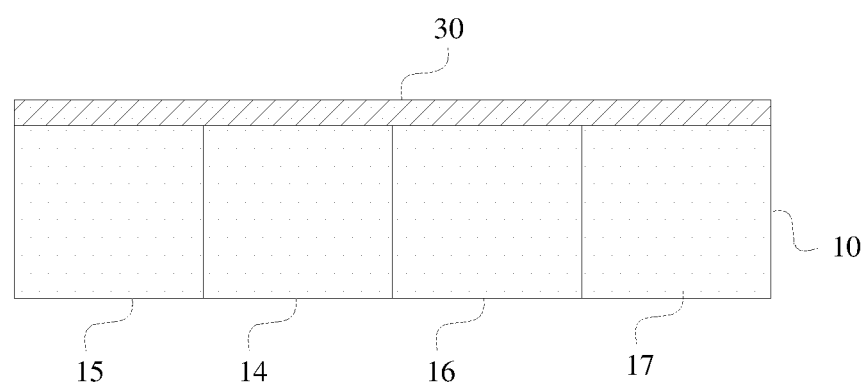
FIG. 12 is a schematic structural diagram after forming of a first oxide layer in the method of manufacturing a semiconductor structure according to an embodiment of the present disclosure.
Figure 13:
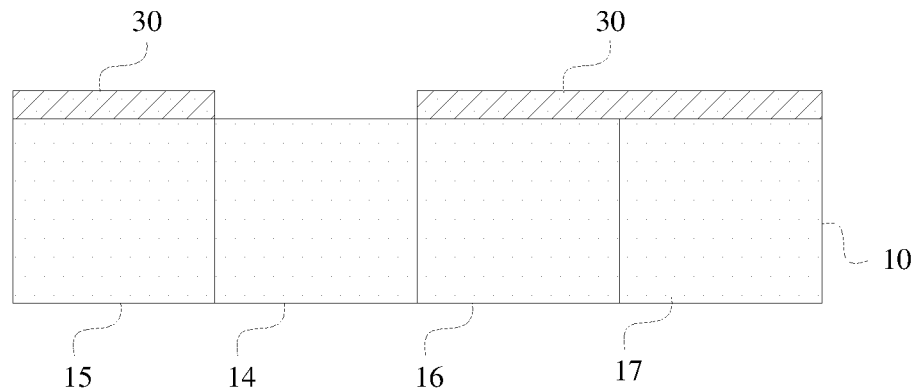
FIG. 13 is a schematic structural diagram after removal of the first oxide layer in a first transistor region in the method of manufacturing a semiconductor structure according to an embodiment of the present disclosure.
Figure 14:
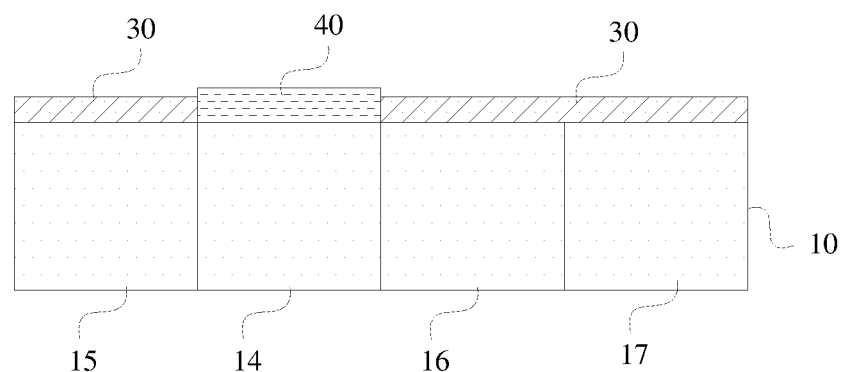
FIG. 14 is a schematic structural diagram after forming of an epitaxial layer in the method of manufacturing a semiconductor structure according to an embodiment of the present disclosure.
Figure 15:
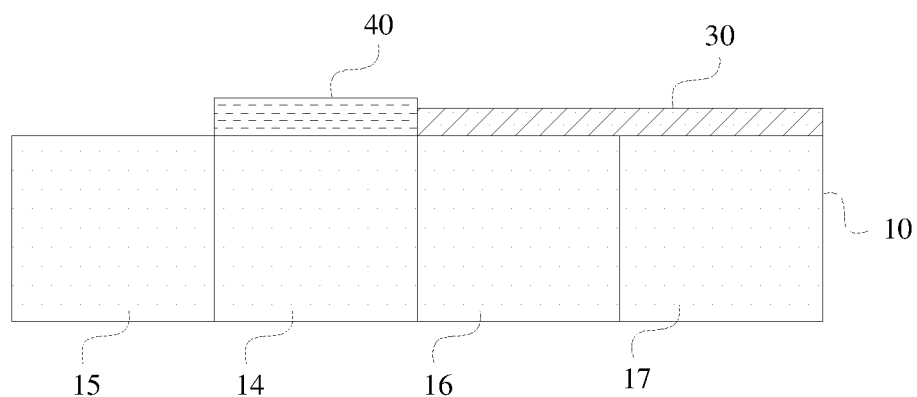
FIG. 15 is a schematic structural diagram after removal of the first oxide layer in a second transistor region in the method of manufacturing a semiconductor structure according to an embodiment of the present disclosure.
Figure 16:
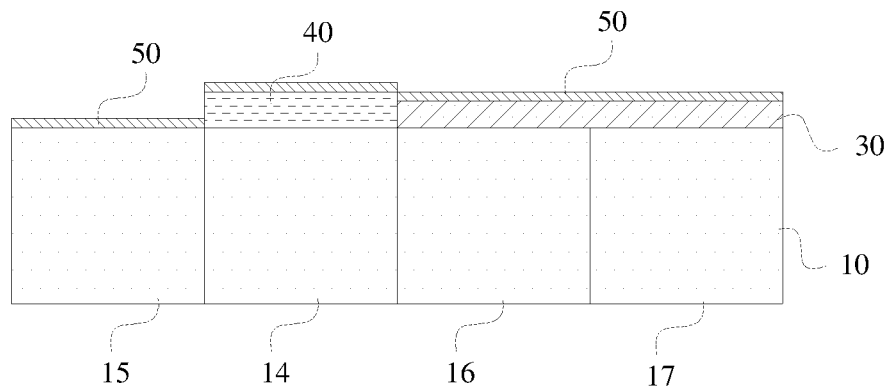
FIG. 16 is a schematic structural diagram after forming of a second oxide layer in the method of manufacturing a semiconductor structure according to an embodiment of the present disclosure.
Figure 17:
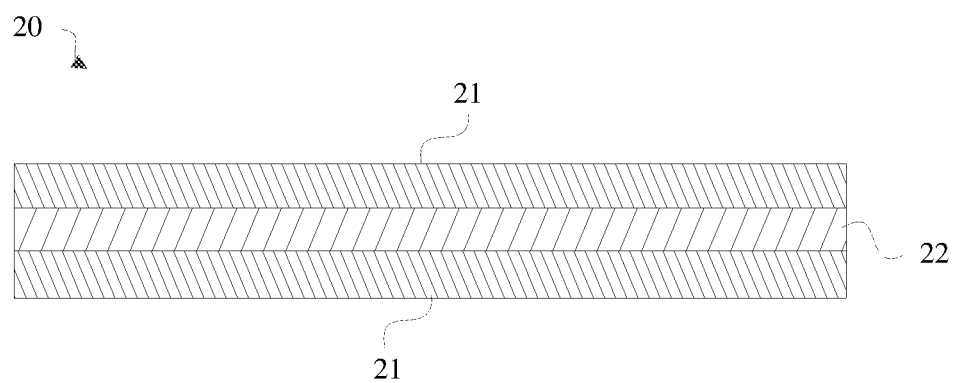
FIG. 17 is a schematic structural diagram of a first type of mask layer in the method of manufacturing a semiconductor structure according to an embodiment of the present disclosure.
Figure 18:
FIG. 18 is a schematic structural diagram of a second type of mask layer in the method of manufacturing a semiconductor structure according to an embodiment of the present disclosure.

FIG. 7 is a schematic flowchart of a method of manufacturing a semiconductor structure according to an embodiment of the present disclosure. FIG. 8 is a schematic flowchart of a work function regulating process in the method of manufacturing a semiconductor structure according to an embodiment of the present disclosure. FIG. 9 is a schematic structural diagram of a semiconductor structure according to an embodiment of the present disclosure. FIG. 10 is a schematic structural diagram after forming of a mask layer in the method of manufacturing a semiconductor structure according to an embodiment of the present disclosure. FIG. 11 is a schematic structural diagram after removal of the mask layer in the method of manufacturing a semiconductor structure according to an embodiment of the present disclosure. FIG. 12 is a schematic structural diagram after forming of a first oxide layer in the method of manufacturing a semiconductor structure according to an embodiment of the present disclosure. FIG. 13 is a schematic structural diagram after removal of the first oxide layer in a first transistor region in the method of manufacturing a semiconductor structure according to an embodiment of the present disclosure. FIG. 14 is a schematic structural diagram after forming of an epitaxial layer in the method of manufacturing a semiconductor structure according to an embodiment of the present disclosure. FIG. 15 is a schematic structural diagram after removal of the first oxide layer in a second transistor region in the method of manufacturing a semiconductor structure according to an embodiment of the present disclosure. FIG. 16 is a schematic structural diagram after forming of a second oxide layer in the method of manufacturing a semiconductor structure according to an embodiment of the present disclosure. FIG. 17 is a schematic structural diagram of a mask layer in the method of manufacturing a semiconductor structure according to an embodiment of the present disclosure. FIG. 18 is a schematic structural diagram of a second type of mask layer in the method of manufacturing a semiconductor structure according to an embodiment of the present disclosure. With reference to FIG. 7 to FIG. 18, an embodiment of the present disclosure provides a method of manufacturing a semiconductor structure.

As shown in FIG. 7, the method of manufacturing a semiconductor structure specifically includes:

S1: Provide a substrate. The substrate 10 includes array regions 11 and a non-array region, the non-array region surrounds each of the array regions 11, and the non-array region includes a first transistor region 14 and a second transistor region 15.

It should be noted that a material of the substrate 10 can be selected from the group consisting of monocrystalline silicon, polycrystalline silicon, amorphous silicon, germanium silicon compound or silicon-on-insulator (SOI), or other materials known to those skilled in the art. The substrate 10 can provide support for structural layers on the substrate 10. In this embodiment, the substrate 10 is a Si substrate.

The semiconductor structure 100 is as shown in FIG. 9. It should be noted that FIG. 9 is only a partial schematic structural diagram of the semiconductor structure 100, and does not represent the entire structure of the semiconductor structure 100. Multiple array regions 11 can be arranged on the substrate 10; a core region 12 is arranged between adjacent array regions 11; a peripheral region 13 is arranged on the periphery of the core region 12. Generally, memory cells are arranged in the array regions 11; an induction amplifier and the like are arranged in the core region 12; a peripheral circuit, a driver circuit, a clock circuit and the like are arranged in the peripheral region 13. In addition, the peripheral region 13 can further include a third transistor region 16 and a fourth transistor region 17. The third transistor region 16 and the fourth transistor region 17 can be configured specifically to form a driver circuit, a clock circuit, etc.

S2: Form a mask layer on the substrate. By forming the mask layer 20 on the substrate 10, the structural layers of the array regions 11 can be protected, to avoid damage on the structural layers of the array regions 11.

S3: Remove the mask layer on the non-array region. This allows the substrate 10 of the non-array region to be exposed, such that a first oxide layer 30 can be formed.

S4: Form a first oxide layer on the non-array region. The first oxide layer 30 is formed on the surface of the substrate 10 of the non-array region. The first oxide layer 30 can act as a barrier layer or an insulating layer for the structure on the non-array region because the oxide layer can block dirty substances from invading the surface of the substrate 10 on the one hand, and has an insulating effect on the other hand.

S5: Remove the first oxide layer on the first transistor region, to expose a top surface of the first transistor region. By removing the first oxide layer 30 on the first transistor region 14, the substrate 10 of the first transistor region 14 can be exposed. In addition, the first oxide layer 30 can further act as a mask, to prevent the epitaxial layer 40 from growing out of the substrate 10 of the first transistor region 14, such that the epitaxial layer 40 is formed on the surface of the exposed substrate 10 of the first transistor region 14.

S6: Form an epitaxial layer on the top surface of the first transistor region. In this way, structural layers with high carrier mobility can be formed on the substrate 10.

S7: Remove the first oxide layer on the second transistor region. In this way, the substrate 10 of the second transistor region 15 can be exposed, such that a second oxide layer 50 is formed on the surface of the substrate 10 of the second transistor region 15.

S8: Form a second oxide layer on the second transistor region and the epitaxial layer.

Specifically, for the structure after each step, refer to FIG. 10 to FIG. 16. In the foregoing manufacturing method, the epitaxial layer 40 is formed after formation of the first oxide layer 30. On the one hand, the first oxide layer 30 can act as a mask. On the other hand, the damage caused by removal of the mask layer 20 through wet etching to the epitaxial layer 40 is avoided. In addition, the forming the epitaxial layer 40 is postponed, such that the epitaxial layer 40 is not provided too early, thus reducing the damage caused by excessive cleaning processes to the epitaxial layer 40, reducing the damage caused by the method of manufacturing a semiconductor structure to the epitaxial layer 40, and improving the storage performance of the semiconductor structure 100.

In one possible implementation, the providing a substrate may include: forming a source region, a channel region, and a drain region sequentially arranged in the first transistor region through ion implantation. Ion implantation, with good controllability and no lateral diffusion, is a preferred doping process for circuits with high density and small critical dimension. Specifically, doping structures can be formed on the substrate 10 by an ion implantation process. During the ion implantation process, the substrate 10 of the channel region can be protected by a mask, and the doping structures can be formed on the substrate 10 of the source region and drain region, thus forming the source region and drain region.

Specifically, the non-array region includes a core region 12 and a peripheral region 13. The core region 12 is located on the periphery of each of the array regions 11, and the peripheral region 13 is located on the periphery of the core region 12. The first transistor region 14 and the second transistor region 15 are both located in the core region 12. Such an arrangement facilitates the installation of induction amplifiers, driver circuits, clock circuits, etc., and helps to reduce the critical dimension of the semiconductor structure 100.

In a possible implementation, the removing the first oxide layer on the first transistor region to expose a top surface of the first transistor region may include: removing the first oxide layer located on the channel region located in the first transistor region. On the one hand, it is possible to form a groove in the top surface of the channel region and expose the surface of the substrate 10 to facilitate epitaxial growth of the epitaxial layer 40. On the other hand, the first oxide layer 30 can act as a mask on the top surface of the source region and drain region of the first transistor region 14.

In a possible implementation, the forming the epitaxial layer on the exposed top surface of the first transistor region may include: forming the epitaxial layer through selective epitaxial growth.

It should be noted that the epitaxial technology can be used to epitaxially grow a high-resistance epitaxial layer on a low-resistance underlayer, or epitaxially grow a low-resistance epitaxial layer on a high-resistance underlayer, and can also be combined with the mask technology to achieve epitaxial growth in a specified area, which can create conditions for the manufacturing of devices with special structures. In the epitaxial process, the compatibility between materials of the epitaxial layer 40 and the substrate 10 should be considered first, where the crystal structure, melting point, vapor pressure, and coefficient of thermal expansion have a great influence on the quality of the epitaxial layer 40; secondly, the contamination of the epitaxial layer 40 caused by the substrate 10 should also be taken into consideration. On the other hand, the similar coefficients of thermal expansion of the substrate 10 and the epitaxial layer 40 are one of the important factors to obtain an epitaxial layer 40 with good heterogeneity. If the coefficients of thermal expansion are significantly different, a large stress will be generated near the interface when the temperature changes, which increases the defects of the epitaxial layer 40 and even causes a warp, thus affecting the performance and thermal stability of the material and semiconductor structure.

Specifically, in the embodiment of the present disclosure, the epitaxial layer 40 is SiGe. Main epitaxial growth methods include, but are not limited to, gas source molecular beam epitaxy (GSMBE), solid source molecular beam epitaxy (SSMBE) and ultrahigh vacuum chemical vapor deposition (UHV/CVD). GSMBE and UHV/CVD methods are similar, both of which use gas as the source of growth. The main difference is the air pressure in the growth chamber during epitaxy. The air pressure is higher for UHV/CVD growth and lower for GSMBE growth. UHV/CVD and GSMBE have obvious advantages over SSMBE in the growth of SiGe materials, e.g., no need for a high-temperature evaporation source furnace, no need to destroy the vacuum of the growth chamber during replacement of the source, thus ensuring the purity of the growth chamber for a long time, facilitating the growth of high-quality materials, and allowing selective epitaxy on the patterned substrate 10. Because the reaction gas is alkane, which contains H, it can also effectively suppress Ge segregation. For the growth of SiGe by UHV/CVD and GSMBE, the Ge source is generally $GeH_4$, and there are two main types of Si sources: $SiH_4$ and $Si_2H_6$. In particular, $Si_2H_6$ has a higher adsorption rate and lower reaction energy than $SiH_4$ on the Si substrate, which is conducive to low-temperature growth, and it is easier to grow high-quality SiGe materials with $Si_2H_6$.

Specifically, materials of the epitaxial layer 40 include silicon and germanium, and a content of germanium ranges from 5% to 50%, while the rest of the elements can be all silicon. Specifically, the content of germanium can be 5%, 10%, 17%, 25%, 38%, 44%, 55%, etc. In this way, since the carrier mobility of SiGe is significantly higher than that of Si, the carrier mobility of the epitaxial layer can be increased, to achieve a high current transfer rate of the MOS transistor. The embodiments of the present disclosure do not limit the content of germanium. Users can choose within the above range according to the actual situation.

It should be noted that the Si substrate is first treated to obtain a clean surface in the growth process. As a possible implementation, it is generally possible to first clean the substrate 10 by means of silicon epitaxy to make the substrate 10 clean, and finally treat it with the solution of $HCL:H_2O_2:H_2O=1:2:7$ or other solutions. This aims to form a thin and clean $SiO_2$ protective layer on the Si surface to prevent the Si surface from being stained before the substrate 10 enters the pretreatment chamber. The substrate 10 after the foregoing treatment is fed into the pretreatment chamber and degassed at 300° C. for a few hours; then the substrate 10 is fed into the growth chamber and the temperature is raised to 850° C. for 10 minutes of deoxidation; after deoxidation, the temperature is lowered to 650° C.; the $Si_2H_6$ source and $GeH_4$ source, a ratio between which is adjusted according to a component x, are fed into the growth chamber to grow the $Si_{1-x}Ge_x$ with the component x. Parameters of the cleaning process of the substrate 10 and the preparation process of SiGe can be adjusted as needed in the actual preparation process, which are not limited in this embodiment.

Specifically, the epitaxial layer 40 has a thickness in the range of 3 nm to 10 nm, and the thickness can be 3 nm, 5 nm, 7 nm, 8 nm, or 10 nm. The above thickness range of the epitaxial layer 40 can ensure high carrier mobility and good performance of the MOS transistor on the one hand, and on the other hand, can make the critical dimension of the semiconductor structure 100 as small as possible. The embodiments of the present disclosure do not limit the thickness of the epitaxial layer 40. Users can choose within the above range according to the actual situation.

In one possible implementation, the removing the first oxide layer on the second transistor region may include: removing the first oxide layer on the second transistor region, to expose the top surface of the second transistor region. This facilitates deposition of the second oxide layer 50 on the top surface of the second transistor region 15.

Specifically, the thickness of the first oxide layer 30 is greater than the thickness of the second oxide layer 50. This allows the first oxide layer 30 to reduce the gate leakage current and the second oxide layer 50 to turn on or to be conductive more easily, such that the first oxide layer 30 and the second oxide layer 50 can be applied to different MOS transistors to achieve different functions.

Specifically, the thickness of the first oxide layer 30 ranges from 4 nm to 8 nm, and the specific thickness can be 4 nm, 6 nm, 7 nm, or 8 nm. In a possible implementation, the thickness of the second oxide layer 50 ranges from 0.5 nm to 2 nm, and the specific thickness can be 0.5 nm, 1 nm, 1.5 nm, or 2 nm. The foregoing thickness ranges of the first oxide layer 30 and the second oxide layer 50 ensure that the MOS transistor can reduce the gate leakage current or turn on more easily on the one hand, and on the other hand, can make the critical dimension of the semiconductor structure 100 as small as possible.

Specifically, the first oxide layer 30 and the second oxide layer 50 are made of the same material. In the embodiments of the present disclosure, both the first oxide layer 30 and the second oxide layer 50 are silicon dioxide, which is an insulating material that can be used to treat the surface of the Si substrate as a doping barrier, surface insulation layer, and an insulating part in the device.

It should be noted that silicon dioxide has high density and hardness. Therefore, silicon dioxide can be used as a contamination barrier layer to prevent environmental contaminants from penetrating the sensitive surface of the substrate 10. At the same time, the hardness of silicon dioxide prevents the surface of the substrate 10 from being scratched during the preparation process and also enhances the durability of the substrate 10 during the production process.

Specifically, the mask layer 20 can include one layer. When the mask layer 20 includes one layer, the material of the mask layer 20 can be silicon dioxide, which on the one hand can protect the sensitive surface of the substrate 10 from environmental contaminants, and on the other hand, the high hardness can prevent the surface of the substrate 10 from being scratched during the preparation process. The mask layer 20 can also include multiple stacked sub-mask layers. As shown in FIG. 17, materials of the mask layer 20 include silicon oxide and silicon nitride, and specifically include two silicon dioxide layers 21 and one silicon nitride layer 22. The silicon nitride layer 22 is located between the two silicon dioxide layers 21. Silicon nitride is a robust mask material that helps to protect the array regions 11. The silicon dioxide layers 21 are provided between the silicon nitride layer 22 and the Si substrate, because the silicon nitride layer 22 has high stress; the silicon dioxide layers 21 can be used as a buffer to avoid easy detachment of the silicon nitride layer 22 due to the stress mismatch between the silicon nitride layer 22 and the Si substrate. As shown in FIG. 17, the first mask layer 20 includes multiple layers; as shown in FIG. 18, the second mask layer 20 includes one layer.

In one possible implementation, as shown in FIG. 2, after the forming a second oxide layer on the second transistor region and the epitaxial layer, the method further includes:

S9: Form a work function regulating layer on the second oxide layer.

S10: Anneal the second oxide layer and the work function regulating layer, where the second oxide layer forms a gate oxide layer.

S11: Remove the work function regulating layer.

It should be noted that, a gate oxide layer may be provided on the second oxide layer 50. The work function regulating layer is located on the gate oxide layer, such that work function diffusion particles are diffused to the interface between the gate oxide layer and the second oxide layer 50, and the work function at the interface between the gate oxide layer and the second oxide layer 50 is adjusted by using the work function diffusion particles in the work function regulating layer. The work function diffusion particles can include chloride ions or lanthanide ions.

Specifically, after the removing the work function regulating layer, the method further includes:

forming a first transistor structure on the surface of the first transistor region, where the first transistor structure is a P-type transistor; and forming a second transistor structure on the surface of the second transistor region, where the second transistor structure is an N-type transistor.

In this way, the PMOS transistor and NMOS transistor can be formed in the core region 12, and the critical dimension of the semiconductor structure 100 can be reduced.

Specifically, a material of the gate oxide layers of the first transistor structure and the second transistor structure is one or more selected from the group consisting of silicon-doped lanthanum oxide, silicon-doped hafnium oxide, and silicon-doped zirconium oxide. The gate oxide layer can reduce the quantum tunneling effect of the gate dielectric layer, thus reducing the gate leakage current of the transistor formed in the semiconductor structure 100 and the consequential high power consumption.

In addition, a material of the gate layers of the first transistor structure and the second transistor structure is selected from the group consisting of titanium, cobalt, aluminum or tungsten. The gate layer including the above material can form a metal gate layer. The metal gate layer can reduce the threshold voltage drift, polysilicon depletion effect, excessive gate resistance, and Fermi-level pinning of existing polysilicon gates, thereby improving the stability of the semiconductor structure 100 and enhancing the performance of transistors formed in the semiconductor structure 100.

On the basis of the above, this embodiment further provides a semiconductor structure. The semiconductor structure 100 can be manufactured using the manufacturing method described above. The semiconductor structure 100 can be a memory, and specifically can include multiple array regions 11 which may be arranged in an array on a substrate 10, a core region 12 between adjacent array regions 11, and a peripheral region 13 on the periphery of the core region 12. An induction amplifier and the like are arranged in the core region 12; a peripheral circuit, a driver circuit, a clock circuit and the like are arranged in the peripheral region 13. Generally, memory cells are arranged in the array regions 11, and each memory cell includes a capacitor and a transistor. The capacitor is configured to store data, and the transistor can control the access to the data by the capacitor.

In the semiconductor structure 100 provided by the present disclosure, the epitaxial layer 40 is formed after formation of the first oxide layer 30. On the one hand, the first oxide layer 30 can serve as a mask. On the other hand, the damage caused by removal of the mask layer 20 through wet etching to the epitaxial layer 40. In addition, the forming the epitaxial layer 40 is postponed, such that the epitaxial layer 40 is not provided too early, thus reducing the damage caused by excessive cleaning processes to the epitaxial layer 40, reducing the damage caused by the method of manufacturing a semiconductor structure to the epitaxial layer 40, and improving the storage performance of the semiconductor structure 100.

In the description, it should be noted that unless otherwise expressly specified and defined, terms such as "mounted", "connected to each other", and "connected to" should be comprehended in a broad sense. For example, a connection may be a fixed connection, an indirect connection through an intermediate medium, or internal communication within two elements, or an interactive relationship between two elements. A person of ordinary skill in the art may understand specific meanings of the foregoing terms in the present disclosure based on a specific situation. Orientations or position relationships indicated by terms "upper", "lower", "front", "rear", "vertical", "horizontal", "top", "bottom", "inside", "outside", etc. are orientation or position relationships as shown in the drawings, and these terms are just used to facilitate description of the present disclosure and simplify the description, but not to indicate or imply that the mentioned device or elements must have a specific orientation and must be established and operated in a specific orientation, and thus, these terms cannot be understood as a limitation to the present disclosure. In the description of the present disclosure, "a plurality of" means two or more, unless otherwise specifically defined.

The terms "first", "second", "third" and so on (if any) in the specification, claims and the accompanying drawings of the present disclosure are intended to distinguish between similar objects but do not necessarily indicate a specific order or sequence. It should be understood that the data used in such a way may be exchanged under proper conditions to make it possible to implement the described embodiments of the present disclosure in other sequences apart from those illustrated or described here. Moreover, the terms "include", "contain", and any other variants mean to cover the non-exclusive inclusion, for example, a process, method, system, product, or device that includes a list of steps or units is not necessarily limited to those steps or units which are clearly listed, but may include other steps or units which are not expressly listed or inherent to such a process, method, system, product, or device.

Finally, it should be noted that the above embodiments are merely used to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present disclosure.

The invention claimed is:

1. A method of manufacturing a semiconductor structure, comprising:
   providing a substrate, wherein the substrate comprises multiple array regions and a non-array region, the non-array region surrounds the array regions and comprises a core region and a periphery region, the core region is located on a periphery of the array regions and also arranged between the array regions, the periphery region is located on a periphery of the core region, and the core region comprises a first transistor region and a second transistor region, the peripheral region comprises a third transistor region and a fourth transistor region;
   forming a mask layer on the substrate;
   removing the mask layer on the non-array region;
   forming a first oxide layer on the non-array region;
   removing the first oxide layer on the first transistor region, to expose a top surface of the first transistor region;
   forming an epitaxial layer on the exposed top surface of the first transistor region;
   removing the first oxide layer only on the second transistor region and keeping the first oxide layer on the third transistor region and the fourth transistor region; and
   forming a second oxide layer on the second transistor region and the epitaxial layer and also on a remaining first oxide layer on the third transistor region and the fourth transistor region;
   wherein a thickness of the first oxide layer is greater than a thickness of the second oxide layer.

2. The method of manufacturing a semiconductor structure according to claim 1, wherein the providing a substrate comprises:
   forming a source region, a channel region, and a drain region sequentially arranged in the first transistor region through ion implantation.

3. The method of manufacturing a semiconductor structure according to claim 2, wherein the removing the first oxide layer on the first transistor region, to expose a top surface of the first transistor region comprises:
   removing the first oxide layer located on the channel region in the first transistor region.

4. The method of manufacturing a semiconductor structure according to claim 1, wherein the forming an epitaxial layer on the exposed top surface of the first transistor region comprises:
   forming the epitaxial layer through selective epitaxial growth.

5. The method of manufacturing a semiconductor structure according to claim 1, wherein materials of the epitaxial layer comprise silicon and germanium, and a content of germanium ranges from 5% to 50%.

6. The method of manufacturing a semiconductor structure according to claim 1, wherein the epitaxial layer has a thickness in a range of 3 nm to 10 nm.

7. The method of manufacturing a semiconductor structure according to claim 1, wherein the removing the first oxide layer only on the second transistor region comprises:
   removing the first oxide layer on the second transistor region, to expose a top surface of the second transistor region.

8. The method of manufacturing a semiconductor structure according to claim 1, wherein the thickness of the first oxide layer ranges from 4 nm to 8 nm; and/or
   the thickness of the second oxide layer ranges from 0.5 nm to 2 nm.

9. The method of manufacturing a semiconductor structure according to claim 1, wherein the first oxide layer and the second oxide layer are made of the same material.

10. The method of manufacturing a semiconductor structure according to claim 1, wherein the mask layer is a single layer, or the mask layer comprises multiple stacked sub-mask layers; and/or
    materials of the mask layer comprise silicon oxide and silicon nitride.

11. The method of manufacturing a semiconductor structure according to claim 1, after the forming a second oxide layer on the second transistor region and the epitaxial layer, the method further comprises:
    forming a work function regulating layer on the second oxide layer;
    annealing the second oxide layer and the work function regulating layer, wherein the second oxide layer forms a gate oxide layer; and
    removing the work function regulating layer.

12. The method of manufacturing a semiconductor structure according to claim 11, after the removing the work function regulating layer, the method further comprises:
    forming a first transistor structure on a surface of the first transistor region, wherein the first transistor structure is a P-type transistor; and forming a second transistor structure on a surface of the second transistor region, wherein the second transistor structure is an N-type transistor.

13. The method of manufacturing a semiconductor structure according to claim 12, wherein a material of gate oxide layers of the first transistor structure and the second transistor structure is one or more selected from the group consisting of silicon-doped lanthanum oxide, silicon-doped hafnium oxide, and silicon-doped zirconium oxide; and/or a material of gate layers of the first transistor structure and the second transistor structure is selected from the group consisting of titanium, cobalt, aluminum and tungsten.

* * * * *